United States Patent
Nagl et al.

(10) Patent No.: US 10,690,186 B2
(45) Date of Patent: Jun. 23, 2020

(54) SLIDING BEARING ELEMENT

(71) Applicant: Miba Gleitlager Austria GmbH, Laakirchen (AT)

(72) Inventors: Johann Nagl, Stadl-Paura (AT); Christian Uebleis, Weisskirchen a. d. Traun (AT)

(73) Assignee: Miba Gleitlager Austria GmbH, Laakirchen (AT)

( * ) Notice: Subject to any disclaimer, the term of this patent is extended or adjusted under 35 U.S.C. 154(b) by 180 days.

(21) Appl. No.: 15/741,569

(22) PCT Filed: Jul. 5, 2016

(86) PCT No.: PCT/AT2016/050241
§ 371 (c)(1),
(2) Date: Jan. 3, 2018

(87) PCT Pub. No.: WO2017/004646
PCT Pub. Date: Jan. 12, 2017

(65) Prior Publication Data
US 2018/0202491 A1   Jul. 19, 2018

(30) Foreign Application Priority Data
Jul. 6, 2015   (AT) .............................. A 50582/2015

(51) Int. Cl.
*C23C 14/16*   (2006.01)
*F16C 33/12*   (2006.01)
(Continued)

(52) U.S. Cl.
CPC .......... *F16C 33/122* (2013.01); *C23C 14/165* (2013.01); *C23C 14/34* (2013.01);
(Continued)

(58) Field of Classification Search
None
See application file for complete search history.

(56) References Cited

U.S. PATENT DOCUMENTS

| 4,889,772 A | 12/1989 | Bergmann et al. |
| 5,045,405 A | 9/1991 | Koroschetz et al. |

(Continued)

FOREIGN PATENT DOCUMENTS

| CN | 103060878 A | 4/2013 |
| DE | 10 2007 026 832 A1 | 12/2007 |

(Continued)

OTHER PUBLICATIONS

International Search Report of PCT/AT2016/050241, dated Nov. 18, 2016.
(Continued)

*Primary Examiner* — Daniel J. Schleis
(74) *Attorney, Agent, or Firm* — Collard & Roe, P.C.

(57) ABSTRACT

The invention relates to a sliding bearing element (1) comprising a supporting layer (2) and a sliding layer (3), the sliding layer (3) being made of silver or silver having a maximum content of other metals of 5% by weight, selected from a group consisting of Cu, Sb, Mo, Co, and the sliding layer (3) has a microstructure with grains (6, 7) and has a sliding layer thickness (12). The microstructure changes on the sliding layer thickness (12) from a globular habitus of the grains (7) in the region of a second surface (9) of the sliding layer (3) closer to the supporting layer (2) to a habitus in an at least approximately columnar form, a longitudinal extension (10) of the grains (7) being arranged in the region of a first surface (8) of the sliding layer (3) farther away from the supporting layer (2).

8 Claims, 1 Drawing Sheet

Figure 1:
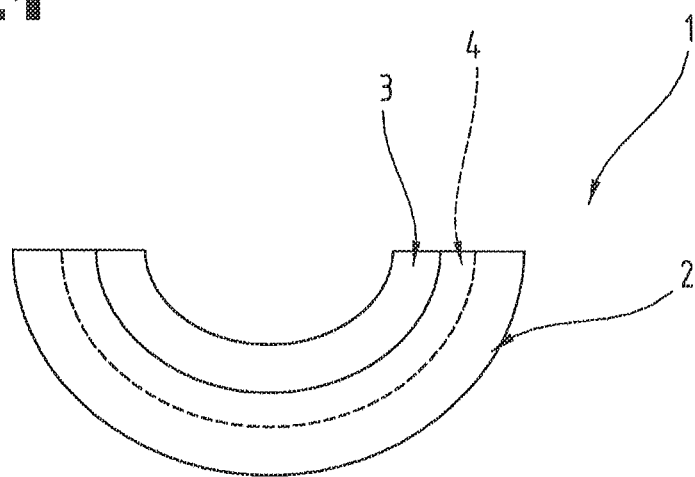

(51) Int. Cl.
*C23C 14/34* (2006.01)
*F16C 17/02* (2006.01)

(52) U.S. Cl.
CPC .......... *C23C 14/3492* (2013.01); *F16C 17/02* (2013.01); *F16C 33/121* (2013.01); *F16C 2204/04* (2013.01)

(56) References Cited

U.S. PATENT DOCUMENTS

| | | | |
|---|---|---|---|
| 6,365,236 B1 | 4/2002 | Maloney | |
| 6,431,758 B1 * | 8/2002 | Lyon | .......................... F16C 9/00 384/276 |
| 7,629,058 B2 | 12/2009 | Takayanagi et al. | |
| 7,862,902 B2 | 1/2011 | Zidar | |
| 9,217,468 B2 | 12/2015 | Asakura et al. | |
| 9,234,294 B2 | 1/2016 | Whitaker et al. | |
| 9,758,891 B2 * | 9/2017 | Bao | .......................... C25D 5/10 |
| 9,982,714 B2 * | 5/2018 | Gaertner | ................. C23C 14/16 |
| 2010/0248999 A1 | 9/2010 | Izumida et al. | |
| 2011/0180413 A1 | 7/2011 | Whitaker et al. | |

FOREIGN PATENT DOCUMENTS

| | | |
|---|---|---|
| DE | 60 2006 000 573 T2 | 3/2009 |
| DE | 11 2012 000 757 T2 | 11/2013 |
| EP | 0 272 447 A2 | 6/1988 |
| EP | 0 300 993 A1 | 1/1989 |
| EP | 1 705 259 A1 | 9/2006 |
| GB | 2 448 662 A | 10/2008 |
| JP | H05-17883 A | 1/1993 |
| JP | H07-54834 A | 2/1995 |
| JP | 2001-225411 A | 8/2001 |
| JP | 2004-068058 A | 3/2004 |
| JP | 2006-057777 A | 3/2006 |
| JP | 2010-222647 A | 10/2010 |
| WO | 2010/005983 A2 | 1/2010 |

OTHER PUBLICATIONS

Letter to European Patent Office in PCT/AT2016/050241, dated Apr. 21, 2017, with English translation of relevant parts.

* cited by examiner

SLIDING BEARING ELEMENT

CROSS REFERENCE TO RELATED APPLICATIONS

This application is the National Stage of PCT/AT2016/050241 filed on Jul. 5, 2016, which claims priority under 35 U.S.C. § 119 of Austrian Application No. A 50582/2015 filed on Jul. 6, 2015, the disclosure of which is incorporated by reference. The international application under PCT article 21(2) was not published in English.

The invention relates to a sliding bearing element comprising a supporting layer and a sliding layer, the sliding layer being made of silver or silver having a maximum content of other metals of 5% by weight, selected from a group consisting of Cu, Sb, Mo, Co, and the sliding layer has a microstructure with grains and has a sliding layer thickness.

The invention further relates to a method for producing a sliding bearing element comprising a supporting layer and a sliding layer having a microstructure with grains, which sliding layer is produced with a sliding layer thickness made of silver or silver with a maximum content of other metals of 5% by weight.

The trend towards greater power densities in the development of new generations of motors and engines has led to more demanding challenges for the development of antifriction layers which exhibit a greater resistance to wear. This wear resistance often goes hand in hand with the demand for high dirt tolerance and smooth run-in behavior. Another trend in the development of materials and material processing is the move away from environmentally harmful materials or processes whilst striving to preserve or improve the tribological and mechanical properties of existing conventional sliding bearing materials.

In order to satisfy the demands of these developments in the sliding bearing industry, the properties required of a sliding bearing are split between several layers. This enables the individual layers to be optimized with a view to obtaining the property profile required of them.

However, there are also known sliding bearings with so-called gradient layers. In this instance, a property, in particular the hardness of the layer, is varied across the layer thickness. This is usually achieved by creating concentration gradients for an alloy component. For example, different mixed phases and/or intermetallic compounds can be deposited across the layer thickness of the sliding bearing, which in turn leads to differing degrees of hardness within the sliding layer. The main disadvantage of this is that intermetallic compounds are usually brittle and there is therefore a risk that the sliding layer may break.

The underlying objective of the invention is to propose a sliding bearing element and a method for producing it, which enable the aforementioned requirements for a higher power density of a motor or an engine to be satisfied.

The objective of the invention is achieved on the basis of the sliding bearing element outlined above in which the microstructure across the sliding layer thickness changes from a globular habitus of the grains in the region of a second surface of the sliding layer closer to the supporting layer to a habitus in an at least approximately columnar form, a longitudinal extension of the grains being arranged in the region of a first surface of the sliding layer farther away from the supporting layer.

The objective of the invention is also achieved by means of the aforementioned method, whereby the temperature is varied during production of the sliding layer, as a result of which the microstructure across the sliding layer thickness changes from a globular habitus of the grains in the region of a second surface of the sliding layer closer to the supporting layer to a habitus in an at least approximately columnar form with a longitudinal extension of the grains in the region of a first surface of the sliding layer farther away from the supporting layer.

The advantage of this is that the sliding layer can be produced relatively easily from only one individual metal—which is silver containing at most 1% by weight of other metals and incidental impurities—and this sliding layer nevertheless exhibits good run-in behavior. The sliding layer may therefore serve as both a run-in layer at the start of operation of the sliding bearing and as a sliding layer as such during normal operation of the sliding bearing after the run-in phase. The structure based on only one metal eliminates the formation of intermetallic phases. The fact that the sliding layer assumes the additional function of a "run-in layer" obviates the need to apply an additional layer for this purpose, which means that the sliding bearing element is of a relatively simple construction and the method for producing the sliding bearing element can be simplified accordingly. Due to the globular grains on the other hand, the sliding layer is also correspondingly hard and is therefore able to satisfy the high demands of resistance to wear placed on motors and engines. In other words, the sliding layer has an appropriate embeddability for dirt particles in the region of one surface and has the required fatigue strength at the other surface, even though it is made from only a single metal or from an alloy containing at most 5% by weight of at least one other metal.

To this end, based on one embodiment, the sliding layer may have a sliding layer thickness of between 10 µm and 100 µm. Below 10 µm, it is difficult to impart the bi-functionality to the sliding layer to a degree that is still sufficient. On the other hand, further increasing the sliding layer thickness to above and beyond 100 µm no longer brings any significant improvement in terms of long-term stability.

Based on another embodiment of the sliding bearing element, the columnar microstructure extends from the first surface of the sliding layer as far as a depth of at least 10% and at most 95% of the sliding layer. As a result of this, the sliding bearing element retains its properties of ability to slide and embeddability with respect to dirt particles for a relatively long period of time. At a layer thickness of less than 10% of the globular proportion of the grains, the softer layer of columnar grains lying above is no longer afforded sufficient support. At a layer thickness of the globular proportion of the grains of more than 95%, on the other hand, the sliding layer already becomes relatively hard, which means that the aforementioned properties are already reduced within a short period of time after the run-in phase.

Furthermore, the sliding layer may be disposed directly on the supporting metal layer and bonded to it, thereby enabling the supporting effect afforded to the columnar grains directly by the supporting metal layer incorporating the globular grains to be improved. Consequently, a longer service life is imparted to a thicker partial layer incorporating the grains with the columnar habitus. Furthermore, the fact that this sliding layer is disposed directly on the supporting layer also simplifies the method by reducing the method steps needed to create the layered structure of the sliding bearing element.

To further improve the aforementioned effects of run-in behavior and running behavior during normal operation of the sliding layer, it is of advantage if the grains with the columnar habitus are oriented with their longitudinal extension at least approximately perpendicular to the first surface of the sliding layer or the longitudinal axes of the grains deviate from this perpendicular orientation by at most 30°.

An improvement in the aforementioned effects of run-in behavior and running behavior during normal operation of the sliding layer could also be observed if the longitudinal extension of the grains having the columnar microstructure corresponds to at least twice the width extension of the grains having the columnar microstructure. Based on this configuration, the grains with the columnar habitus were more effectively mutually supported in the circumferential direction and in the axial direction of the sliding bearing element.

In order to create an improved bonding zone between the supporting layer and sliding layer and/or between the latter and the layer of the sliding bearing element disposed underneath it, an average diameter of the grains with the globular habitus may be at most 20% of the length in the longitudinal extension of the grains with the columnar habitus. Due to the finer grains, the sliding layer region having the globular grains may also have a higher hardness and hence a better long-term behavior with respect to strength and wear resistance.

Based on one embodiment of the method, the temperature may be increased during production of the sliding layer. This makes it easier to obtain the desired structure.

To provide a clearer understanding, the invention will be explained in more detail below with reference to the appended drawings.

Figure 2:
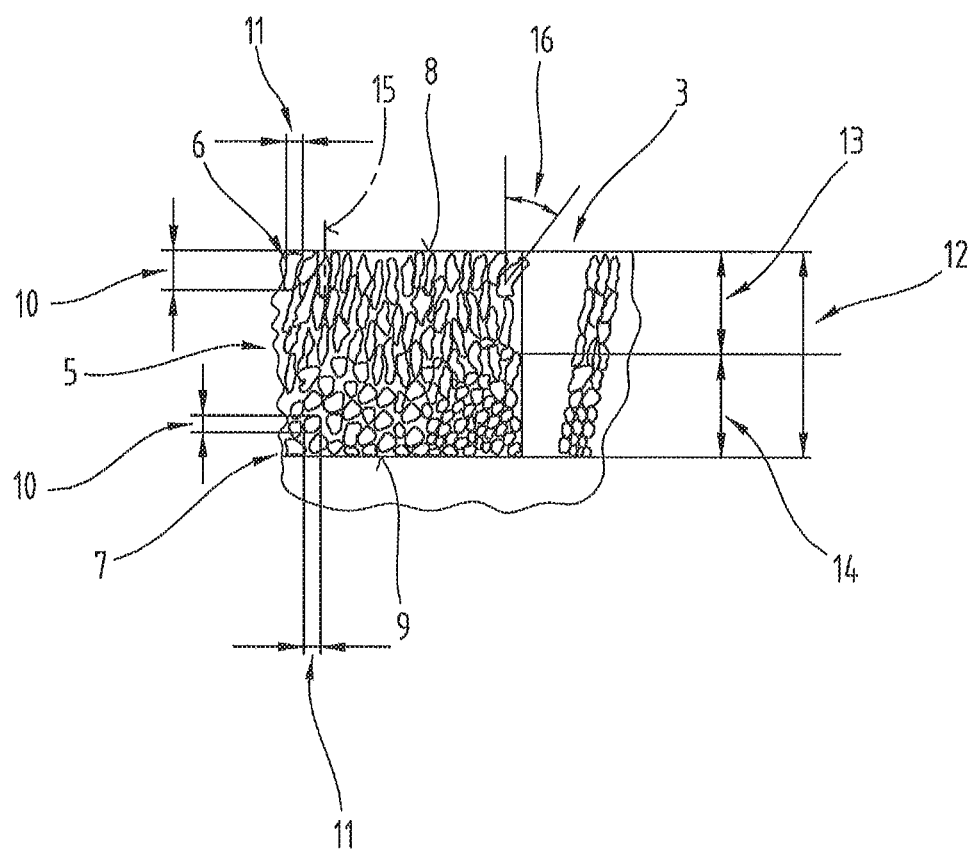

These are highly simplified, schematic diagrams respectively illustrating the following:

FIG. 1 a side view of a sliding bearing element in the form of a sliding bearing half-shell;

FIG. 2 a schematic diagram illustrating the change in the microstructure of the sliding layer across its layer thickness.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described.

FIG. 1 is a side view illustrating a multi-layered sliding bearing element 1 (multi-layered sliding bearing) in the form of a sliding bearing half-shell. The preferred two-layer embodiment of this sliding bearing element 1 is illustrated, consisting of a metal supporting layer 2 and a sliding layer 3 formed directly on top of the supporting layer 2. The sliding layer 3 is the layer on which the component to be mounted slides.

It should be pointed out that other layers may be provided, such as for example a bearing metal layer 4 between the sliding layer 3 and supporting layer 2, as shown by broken lines in FIG. 1 indicating a three-layer variant in which the bearing metal layer 4 is applied directly on top of the supporting layer 2 and the sliding layer 3 is applied directly on top of the bearing metal layer 4. Similarly, between the sliding layer 3 and bearing metal layer 4 and/or between the supporting layer 2 and sliding layer 3 or bearing metal layer 4, it is possible to provide an adhesive layer and/or a diffusion barrier layer or to provide a run-in layer on the sliding layer 3. Furthermore, an anti-fretting layer may be provided on the rear face of the supporting layer 2.

The sliding bearing element 1 may also be of a design different from that illustrated in FIG. 1, for example a bearing bush. Similarly, designs such as thrust rings, axially running sliding shoes or such like are also possible. Also possible are sliding bearing elements 1 which cover an angular range other than 180°. The supporting layer 2 may optionally also be a connecting rod, the eye of which is directly coated with the sliding layer 3. In general terms, the sliding layer 3 can be applied directly to a component in order to make the sliding bearing element 1, such as for example a gear for an aircraft engine. The sliding bearing element 1 is therefore not a conventional sliding bearing in the narrower sense, in other words in the sense of a sliding bearing half-shell for example. Rather, a sliding bearing element 1 should be understood as being an element which is provided with the sliding layer 3. In the case of applying direct coatings, the element itself becomes the supporting layer 2.

The supporting layer 2 is made from a material which imparts the requisite structural strength to the sliding bearing element 1. However, the preferred embodiment of the sliding bearing element 1 is made from steel.

If a bearing metal layer 4 is provided, it may be made from a range of different alloys used for this purpose and known from the relevant field of the prior art. However, the bearing metal layer 4 is preferably made from a bronze, in particular a leaded bronze.

The bearing metal layer 4 may be deposited on and/or applied to the supporting layer 2 using a conventional method known from the field of sliding bearings. For example, a bimetal comprising the supporting layer 2 and the bearing metal layer 3 may be produced by a process of rolling onto the bearing metal layer 3. The bearing metal layer 4 may also be produced by a process of casting onto the supporting layer 2. This bimetal is optionally processed by forming and/or machining involving the removal of material.

If an adhesive layer or a diffusion barrier layer is provided, the conventional materials known for this purpose may be used.

The sliding layer 3 comprises up to 100% by weight of silver or silver optionally containing up to 5% by weight, in particular between 0.01% by weight to 5% by weight, of at least one other metal and optionally incidental impurities. Apart from impurities, the sliding layer 3 is therefore made from either a single metal, namely pure silver or high-purity silver, or from a silver alloy. The other metal might be at least one metal selected from a group comprising or consisting of Cu, Sb, Mo, Co.

As is the case with every metal, the silver of the sliding layer 3 has a microstructure 5 which is characterized by the nature of any pre-treatment and/or the deposition method used. The microstructure 5 of the sliding layer 3 is schematically illustrated in FIG. 2.

This microstructure 5 is made up of first grains 6 and second grains 7 adjoining one another at the grain interfaces.

The first grains 6 are disposed or arranged adjoining a first surface 8 of the sliding layer 3. The second grains 7 are disposed or arranged adjoining a second surface 9 of the sliding layer 3. In this context, the second surface 9 is the surface of the sliding layer 3 which lies closer to the supporting layer 2. Based on the preferred embodiment of the sliding bearing element 1, the sliding layer 3 lies above the second surface 9 on the supporting layer 2. Accordingly, the first surface 9 is that surface of the two surfaces of the sliding bearing element 1 which is farther away from the supporting layer 2. In particular, a component to be mounted slides on this second surface 9. If the sliding bearing element 1 is of a bush or half-shell design, the second surface 9 is therefore the radially inner surface and the first surface 8 is the radially outer surface of the sliding layer 3.

The first grains 6 have a columnar habitus. This columnar habitus may also be described as an at least approximately pillar-shaped habitus.

Within the meaning of the invention, a grain 6 has a columnar habitus if a longitudinal extension 10 of the grain 6 is at least 1.5 times a width extension 11 of the grain 6.

By contrast with the first grains 6, the second grains 7 have a globular habitus.

Within the meaning of the invention, a grain 7 has a globular habitus if the longitudinal extension 10 of the grain 7 is less than 1.5 times smaller, in particular less than 1.3 times smaller than the width extension 11 of the grain 7. A globular grain 7 may therefore be at least approximately spherical in shape.

The sliding layer 3 has a total sliding layer thickness 12 from the first surface 8 to the second surface 9. Based on the preferred embodiment, the sliding layer thickness 12 is selected from a range with a lower limit of 10 µm, in particular 15 µm, and an upper limit of 100 µm.

The first grains 6 are disposed or arranged at up to a first depth 13 of the sliding layer 9 from the first surface 8 in the direction towards the second surface 9 of the sliding layer and the second grains 7 are disposed or arranged at up to a second depth 14 of the sliding layer 9 from the second surface 9 in the direction towards the first surface 8 of the sliding layer. The first depth 13 and the second depth 14 together make up the total sliding layer thickness 12. Consequently, the columnar habitus of the first grains 6 changes within the sliding layer 3 to the globular habitus of the second grains 7.

At this stage, it should be pointed out that it is preferable if the first grains 6 are exclusively of a columnar habitus and the second grains 7 are exclusively of a globular habitus. However, other embodiments of the sliding layer 3 are possible in which the first grains 6 are predominantly of a columnar habitus and the second grains 7 are predominantly of a globular habitus. The term "predominantly" is intended to mean that a proportion of at least 80%, in particular at least 90%, of the first grains 6 have a columnar habitus relative to the totality of first grains 6 in the volume of the sliding layer 3 defined by the first surface 8 and first depth 13 of the sliding layer thickness 12 and a proportion of at least 80%, in particular at least 90%, of the second grains 7 have a globular habitus relative to the totality of second grains 7 in the volume of the sliding layer 3 defined by the first surface 8 and second depth 13 of the sliding layer thickness 12.

This change in the microstructure of the sliding layer 3 can be produced by varying the temperature during the process of producing and/or depositing the sliding layer 3. The sliding layer 3 is preferably produced and/or deposited on the layer disposed underneath the sliding layer 3, in particular the supporting layer, by means of a PVD method, in particular by cathode sputtering. In this respect, it is even more preferable if the temperature is increased during the process of producing and/or depositing the sliding layer 3. In particular, the temperature may be increased by a value selected from a range of 10° C. to 50° C.

Based on one embodiment of the sliding bearing element 1, the columnar microstructure of the sliding layer 3 may extend from the first surface 8 of the sliding layer 3 as far as a depth 13 of the sliding layer 3 of at least 10%, in particular at least 20%, and at most 95%, in particular at most 75%. This can be achieved by an appropriate temperature control, in particular in the specified range of temperature change.

It is also preferable if the first grains 6 having the columnar habitus are oriented with their longitudinal extension 10 at least approximately perpendicular to the first surface 8 of the sliding layer 3, as illustrated in the left-hand part of FIG. 2, or if the longitudinal axes 15 of the first grains 6 deviate from this perpendicular orientation by an angle 16 of at most 30°, in particular at most 20°, preferably at most 10°. This can likewise be achieved by means of an appropriate temperature control, in particular in the specified range of temperature change.

As already explained above, columnar first grains 6 grains should be understood as meaning those of which the longitudinal extension 10 is at least 1.5 times the width extension 11.

However, a preferred embodiment of the sliding bearing element 1 is one in which the columnar first grains 6 have a longitudinal extension 10 that is at least twice, in particular at least three times, preferably at least four times the width extension. This embodiment of the sliding bearing element 1 can also be obtained by an appropriate temperature control, in particular in the specified range of temperature change.

An average diameter of the second grains 7 having the globular habitus may preferably be at most 20% of the length in the longitudinal extension 10 of the first grains 6 having the columnar habitus. This can be achieved by selecting the temperature at the start of the process of depositing the sliding layer accordingly. The length of the columnar grains 6 may be between 4 µm and 80 µm for example.

It should be pointed out that the longitudinal extension 10 of the first grains 6 should be understood as meaning that direction in which the respective first grain has its longest length. Accordingly, the width extension 11 should be understood as meaning the direction extending perpendicular to the longitudinal extension 10. The biggest dimension of the respective grain is thus viewed in this former direction.

Where relative figures are given above in connection, with the longitudinal extension 10 of the first grains 6, an average longitudinal extension should be understood as meaning an arithmetic average of the longitudinal extension 10, i.e. length, calculated on the basis of twenty individual grains having a columnar habitus.

By average diameter of the second grains 7 having a globular habitus is meant the arithmetic average of twenty individual values of the diameter of the sphere completely enveloping the respective grain 7 considered.

The transition between the globular and columnar habitus of the microstructure of the sliding layer 3 may occur abruptly. The hardness of the sliding layer 3 therefore changes abruptly from hard at the second surface 9 to relatively softer at the first surface 8. However, it is preferable to create a hardness gradient across the cross-section as viewed in the direction of the sliding layer thickness 12 whereby the habitus of the first grains 6 changes on a gradient to the habitus of the second grains 7. The second grains 7 having the smallest diameter may be deposited in the region of the second surface 7, in other words at the start of depositing the sliding layer 3. By increasing the temperature during the process of depositing the sliding layer 3, the second grains 7 deposited or applied on top of the initially deposited grains 7 are deposited or applied with a relatively larger diameter. As the process of depositing the sliding layer 3 progresses, the second grains 7 become larger until they change to the columnar habitus of the first grains 6 by further increasing the temperature. As the temperature is increased still further, the first grains 6 deposited or applied have an increasingly bigger longitudinal extension 10 until they reach their maximum longitudinal extension at the first surface. The result of this method is schematically illustrated in the right-hand part of FIG. 2.

It should be pointed out in the context of this method that situations may arise in which there is also amongst the first grains 6 having the biggest longitudinal extension a minority of first grains 6 having a relatively shorter longitudinal extension 10, for example. However, this is acceptable in the context of this method, provided a hardness gradient is created across the cross-section of the sliding layer thickness 12, in particular exhibiting a continuously decreasing hardness.

In order to evaluate the sliding bearing element, the following embodiments, amongst others, were prepared as examples. For this purpose, sliding layers 3 of pure silver were deposited on supporting layers 2 of steel formed to obtain half-shells by means of DC magnetron sputtering in each case under the conditions set out below.

|  |  | Example | | |
| --- | --- | --- | --- | --- |
|  |  | A | B | C |
| Substrate temperature at the start of coating | ° C. | 210 | 230 | 165 |
| Substrate temperature at the end of coating | ° C. | 220 | 260 | 200 |
| Average coating rate | µm/min | 1.65 | 0.48 | 1.97 |
| Process gas | — | Ar | Kr | Ar |
| Process gas pressure | Pa | 0.7 | 2.3 | 6.0 |
| Voltage on the substrate | V | −40 | −50 | 0 |
| Voltage on the target | V | −532 | −440 | −580 |
| Layer hardness at the surface | HV0,005 | 116 | 104 | 133 |
| Layer hardness at the bonding zone | HV0,005 | 132 | 162 | 154 |
| Thickness of the globular region | µm | 42 | 12 | 8 |
| Thickness of the columnar region | µm | 38 | 23 | 70 |

Similar results in terms of the relationship between hardness values at the surface and bonding zone are achieved if, instead of pure silver, a silver alloy is produced, having a proportion of at most 5% by weight of at least one of the elements Cu, Sb, Mo, Co. For this reason, these results are not set out here.

The process gas pressure may generally be selected from a range of from 0.3 Pa to 10 Pa. Optionally, it is also possible to change the habitus of the grains of the sliding layer by varying the process gas pressure during the deposition process, in particular in conjunction with the change in temperature.

In terms of process gases, it is preferable to use at least one of the gases argon or krypton. However, it would also be possible to use other gases, in particular inert gases.

The embodiments illustrated and described as examples represent possible variants of the sliding bearing element 1, and it should be pointed out at this stage that various combinations of the individual embodiments with one another are also possible.

For the sake of good order, finally, it should be pointed out that, in order to provide a clearer understanding of the structure of the sliding bearing element 1, it and its constituent parts are illustrated to a certain extent out of scale and/or on an enlarged scale and/or on a reduced scale.

LIST OF REFERENCE NUMBERS

1 Sliding bearing element
2 Supporting layer
3 Sliding layer
4 Bearing metal layer
5 Microstructure
6 Grain
7 Grain
8 Surface
9 Surface
10 Longitudinal extension
11 Width extension
12 Sliding layer thickness
13 Depth
14 Depth
15 Longitudinal axis
16 Angle

The invention claimed is:

1. Sliding bearing element (1) comprising a supporting layer (2) and a sliding layer (3), the sliding layer (3) being made of silver or silver having a maximum content of other metals of 5% by weight, selected from a group consisting of Cu, Sb, Mo, Co, and the sliding layer (3) has a microstructure with grains (6, 7) and has a sliding layer thickness (12),
wherein the microstructure across the sliding layer thickness (12) changes from a globular habitus of the grains (7) in the region of a second surface (9) of the sliding layer (3) closer to the supporting layer (2) to a habitus in an at least approximately columnar form, a longitudinal extension (10) of the grains (7) being arranged in a region of a first surface (8) of the sliding layer (3) farther away from the supporting layer (2); and
wherein a component to be mounted slides on the sliding layer.

2. Sliding bearing element according to claim 1, wherein the sliding layer (3) has a sliding layer thickness (12) of between 10 µm and 100 µm.

3. Sliding bearing element (1) according to claim 1, wherein the columnar microstructure extends from the first surface (8) of the sliding layer (3) as far as a depth (13) of the sliding layer (3) of at least 10% and at most 95% of the total sliding layer thickness (12).

4. Sliding bearing element (1) according to claim 1, wherein the sliding layer (3) is disposed directly on the supporting layer (2) and bonded to it.

5. Sliding bearing element (1) according to claim 1, wherein the grains (6) with the columnar habitus are oriented with their longitudinal extension (10) at least approximately perpendicular to the first surface (8) of the sliding layer (3) or longitudinal axes (15) of the grains (6) deviate from this perpendicular orientation by at most 30°.

6. Sliding bearing element (1) according to claim 1, wherein the longitudinal extension (10) of the grains (6) with the columnar microstructure corresponds to at least twice the width extension (11) of the grains (6) with the columnar microstructure.

7. Sliding bearing element (1) according to claim 1, wherein an average diameter of the grains (7) with the globular habitus is at most 20% of the length in the longitudinal extension (10) of the grains (6) with the columnar habitus.

8. Method for producing a sliding bearing element (1) comprising a supporting layer (2) and a sliding layer (3) having a microstructure with grains (6, 7), which sliding layer (3) is produced with a sliding layer thickness (12) made of silver or silver with a maximum content of other metals of 5% by weight, selected from a group consisting of Cu, Sb, Mo, Co, by means of a PVD process,
  wherein the temperature is increased during production of the sliding layer (3) by a value selected from a range of 10° C. to 50° C., as a result of which the microstructure across the sliding layer thickness (12) changes from a globular habitus of the grains (7) in the region of a second surface (9) of the sliding layer (3) closer to the supporting layer (2) to a habitus in an at least approximately columnar form with a longitudinal extension (10) of the grains (6) in the region of a first surface (8) of the sliding layer (3) farther away from the supporting layer (2); and
  wherein a component to be mounted slides on the sliding layer.

* * * * *